US 10,714,565 B2

(12) United States Patent
Nam et al.

(10) Patent No.: US 10,714,565 B2
(45) Date of Patent: Jul. 14, 2020

(54) SEMICONDUCTOR DEVICE WITH SUPPORT PATTERN

(71) Applicant: SAMSUNG ELECTRONICS CO., LTD., Suwon-si, Gyeonggi-do (KR)

(72) Inventors: Ki-hyung Nam, Yongin-si (KR); Bong-Soo Kim, Yongin-si (KR); Yoosang Hwang, Suwon-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

(21) Appl. No.: 16/593,438

(22) Filed: Oct. 4, 2019

(65) Prior Publication Data

US 2020/0035781 A1 Jan. 30, 2020

Related U.S. Application Data

(63) Continuation of application No. 16/115,690, filed on Aug. 29, 2018, now Pat. No. 10,483,346.

(30) Foreign Application Priority Data

Jan. 3, 2018 (KR) .................. 10-2018-0000772

(51) Int. Cl.
*H01L 29/41* (2006.01)
*H01L 49/02* (2006.01)
(Continued)

(52) U.S. Cl.
CPC ........ *H01L 28/90* (2013.01); *H01L 21/02164* (2013.01); *H01L 21/28525* (2013.01); *H01L 21/28568* (2013.01); *H01L 21/31111* (2013.01); *H01L 21/32139* (2013.01); *H01L 27/108* (2013.01); *H01L 27/10808* (2013.01); *H01L 27/10823* (2013.01); *H01L 27/10852* (2013.01); *H01L 27/10885* (2013.01); *H01L 27/10888* (2013.01); *H01L 27/10891* (2013.01); *H01L 27/112* (2013.01); *H01L 29/41* (2013.01)

(58) Field of Classification Search
CPC ........... H01L 27/11213; H01L 27/1128; H01L 27/11514
See application file for complete search history.

(56) References Cited

U.S. PATENT DOCUMENTS 8,111,501 B2   2/2012  Kim
8,790,986 B2   7/2014  Choi et al.
(Continued)

FOREIGN PATENT DOCUMENTS

JP       2014-86492 A      5/2014
KR   10-2004-0060081 A    7/2004
(Continued)

*Primary Examiner* — Cheung Lee
(74) *Attorney, Agent, or Firm* — Lee IP Law, P.C.

(57) ABSTRACT

A semiconductor device including a plurality of pillars on a semiconductor substrate; and a support pattern in contact with some lateral surfaces of the pillars and connecting the pillars with one another, wherein the support pattern includes openings that expose other lateral surfaces of the pillars, each of the pillars includes a first pillar upper portion in contact with the support pattern and a second pillar upper portion spaced apart from the support pattern, and the second pillar upper portion has a concave slope.

22 Claims, 13 Drawing Sheets

(51) Int. Cl.
*H01L 27/108* (2006.01)
*H01L 21/311* (2006.01)
*H01L 21/285* (2006.01)
*H01L 21/02* (2006.01)
*H01L 21/3213* (2006.01)
*H01L 27/112* (2006.01)

(56) References Cited

U.S. PATENT DOCUMENTS

| | | |
|---|---|---|
| 9,287,270 B2 | 3/2016 | Oh et al. |
| 9,673,272 B2 | 6/2017 | Choi et al. |
| 2005/0104110 A1 | 5/2005 | Yeo et al. |
| 2008/0186648 A1 | 8/2008 | Choi et al. |
| 2017/0170185 A1 | 6/2017 | Kim et al. |
| 2017/0194261 A1 | 7/2017 | Yoon et al. |
| 2018/0301457 A1* | 10/2018 | Lee .................. H01L 27/10855 |

FOREIGN PATENT DOCUMENTS

| | | |
|---|---|---|
| KR | 10-2005-0055077 A | 6/2005 |
| KR | 10-2009-0113613 A | 11/2009 |
| KR | 10-2013-0067136 A | 6/2013 |
| KR | 10-2015-0039361 A | 4/2015 |
| KR | 10-2016-0044141 A | 4/2016 |
| KR | 10-2017-0069347 A | 6/2017 |
| KR | 10-2017-0082295 A | 7/2017 |

* cited by examiner

SEMICONDUCTOR DEVICE WITH SUPPORT PATTERN

CROSS-REFERENCE TO RELATED APPLICATIONS

This is a continuation application based on pending application Ser. No. 16/115,690, filed Aug. 29, 2018, the entire contents of which is hereby incorporated by reference.

Korean Patent Application No. 10-2018-0000772 filed on Jan. 3, 2018, in the Korean Intellectual Property Office, and entitled: "Semiconductor Device With Support Pattern," is incorporated by reference herein in its entirety.

BACKGROUND

1. Field

Embodiments relate to a semiconductor device including a support pattern.

2. Description of the Related Art

Semiconductor devices are beneficial in electronic industry because of their small size, multi-functionality, and/or low fabrication cost.

SUMMARY

The embodiments may be realized by providing a semiconductor device including a plurality of pillars on a semiconductor substrate; and a support pattern in contact with some lateral surfaces of the pillars and connecting the pillars with one another, wherein the support pattern includes openings that expose other lateral surfaces of the pillars, each of the pillars includes a first pillar upper portion in contact with the support pattern and a second pillar upper portion spaced apart from the support pattern, and the second pillar upper portion has a concave slope.

The embodiments may be realized by providing a semiconductor device including a plurality of bottom electrodes on a semiconductor substrate; and a support pattern in contact with some lateral surfaces of the bottom electrodes and connecting the bottom electrodes with one another, wherein the support pattern includes openings that expose other lateral surfaces of the bottom electrodes, and each of upper portions of the bottom electrodes has a partially concave slope.

The embodiments may be realized by providing a semiconductor device including a plurality of bottom electrodes on a semiconductor substrate; and a support pattern in contact with some lateral surfaces of the bottom electrodes and connecting the bottom electrodes with one another, wherein the support pattern includes an opening that exposes other lateral surfaces of the bottom electrodes, each of upper portions of the bottom electrodes has a partially concave slope, and a bottom surface of the support pattern is farther from the semiconductor substrate than a bottom end of the concave slope.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
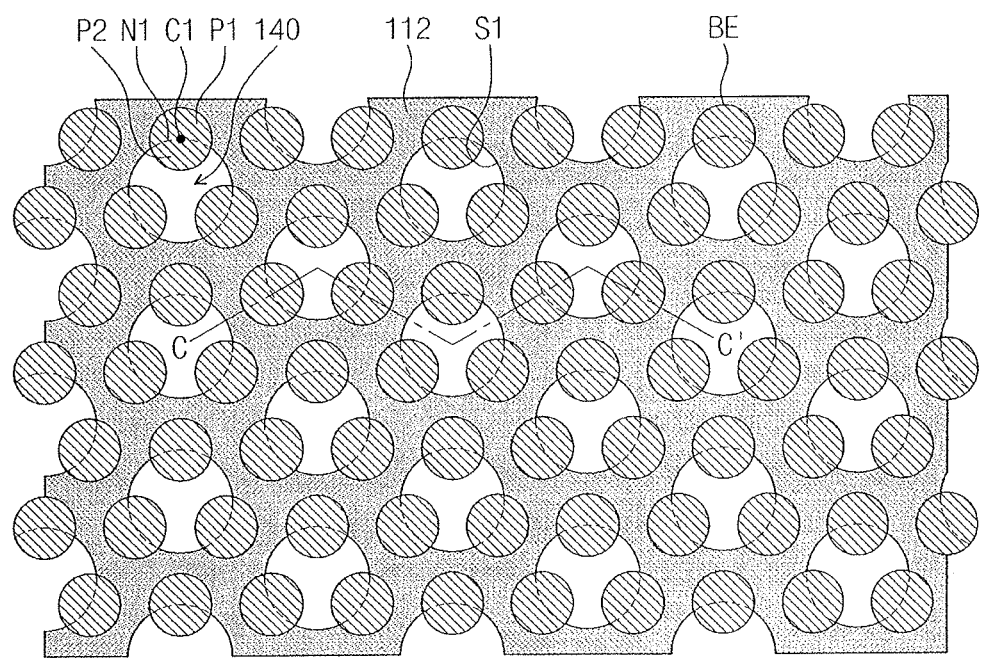
FIG. 1 illustrates a plan view showing a semiconductor device according to exemplary embodiments.
Figure 2:
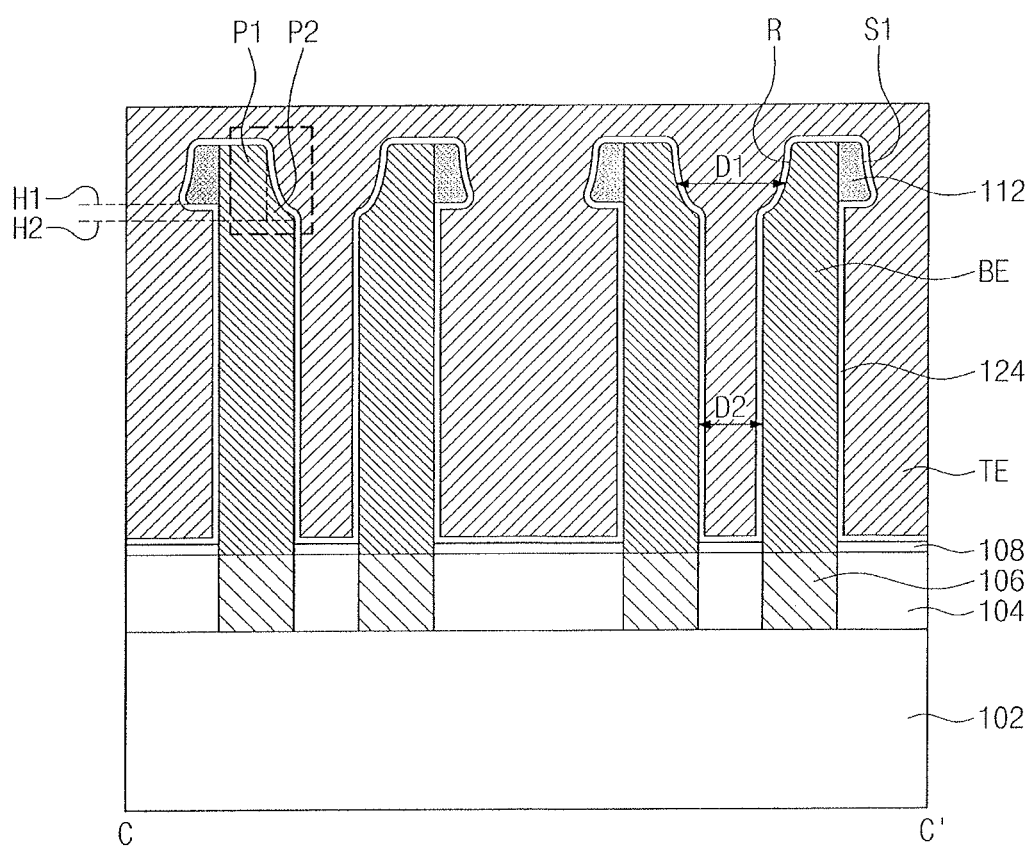
FIG. 2 illustrates a cross-sectional view taken along line C-C' of FIG. 1.
Figure 3A:
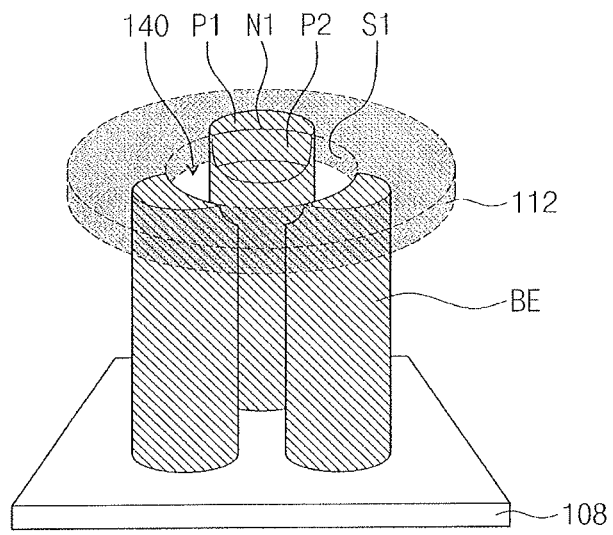
FIG. 3A illustrates a perspective view showing a portion of FIG. 1 or 2.
Figure 3B:
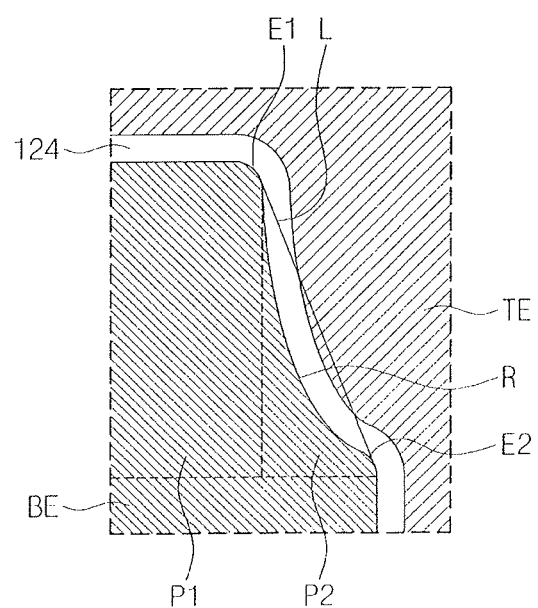
FIG. 3B illustrates an enlarged cross-sectional view showing an upper portion of a bottom electrode.

FIG. 1 illustrates a plan view showing a semiconductor device according to exemplary embodiments. FIG. 2 illustrates a cross-sectional view taken along line C-C' of FIG. 1. FIG. 3A illustrates a perspective view showing a portion of FIG. 1 or 2. FIG. 3B illustrates an enlarged cross-sectional view showing an upper portion of a bottom electrode.

Referring to FIGS. 1, 2, 3A, and 3B, a semiconductor substrate 102 may be provided. The semiconductor substrate 102 may be or include, e.g., a single crystalline silicon substrate. An interlayer dielectric layer 104 may be disposed on the semiconductor substrate 102. The interlayer dielectric layer 104 may be formed of, e.g., a silicon oxide layer. The interlayer dielectric layer 104 may be provided therein with a plurality of bottom electrode contacts 106 that penetrate the interlayer dielectric layer 104 to come into electrical connection to the semiconductor substrate 102. The bottom electrode contacts 106 may include one or more of an impurity-doped polysilicon pattern, a titanium nitride layer, and a tungsten layer.

In an implementation, the semiconductor substrate 102 may be provided thereon with a device isolation layer defining active regions. The semiconductor substrate 102 may be provided therein with buried word lines. The word lines may be insulated from the semiconductor substrate 102 though gate dielectric layers and capping patterns. Source/drain regions may be provided to include impurity-implanted regions disposed in the semiconductor substrate 102 on opposite sides of each of the word lines. The impurity-implanted regions on one side of each of the word lines may be electrically connected to corresponding bit lines. The bottom electrode contacts 106 may be electrically connected to corresponding impurity-implanted regions on an opposite side of each of the word lines.

An etch stop layer 108 may be disposed on the interlayer dielectric layer 104. The etch stop layer 108 may be formed of, e.g., a silicon nitride layer. The etch stop layer 108 may be provided thereon with bottom electrodes BE that penetrate the etch stop layer 108 to come into contact with corresponding bottom electrode contacts 106. The bottom electrodes BE may all have the same shape and be formed of the same material. For example, the bottom electrodes BE may be formed of titanium nitride or impurity-doped polysilicon. The bottom electrodes BE may have a pillar shape with a circular cross-section in a plan view as shown in FIG. 1, and a plug shape with no cavity in a cross-sectional view as shown in FIG. 2.

Each of the bottom electrodes BE may have a lateral surface whose upper portion is in contact with a support pattern 112. The support pattern 112 may be formed of, e.g., a silicon nitride layer. The support pattern 112 may be in contact with the lateral surfaces of all of the bottom electrodes BE. The support pattern 112 may include openings 140. As illustrated in the cross-sectional view of FIG. 2, the support pattern 112 may have an upper portion and a lower portion. A width of the lower portion may be greater than a width of the upper portion. The support pattern 112 may have a lateral surface with a recessed profile.

Each of the bottom electrodes BE may include a first pillar upper portion P1 in contact with the support pattern 112 and a second pillar upper portion P2 spaced apart from the support pattern 112. The first pillar upper portion P1 may have a top end (e.g., an end that is distal to the semiconductor substrate 102) at the same height (e.g., distance from the semiconductor substrate 102) as that of a top end of the support pattern 112. The first pillar upper portion P1 may have a top surface that is coplanar with that of the support pattern 112. The second pillar upper portion P2 may be exposed within a corresponding one of the openings 140. The second pillar upper portion P2 may have a recessed face R. The recessed face R may be called a concave slope. The recessed face R may be a curved surface. The recessed face R may retreat from a straight line L between a lower end edge E2 of the second pillar upper portion P2 and an upper end edge E1 of the first pillar upper portion P1 adjacent to the second pillar upper portion P2. The lower end edge E2 of the second pillar upper portion P2 may correspond to a bottom end of the recessed face R. The support pattern 112 may have a bottom surface at a first height H1 (e.g., a first distance from the semiconductor substrate 102). The lower end edge E2 of the second pillar upper portion P2 may be located at a second height H2 (e.g., a second distance from the semiconductor substrate 102). The first height H1 may be greater than the second height H2.

As illustrated in FIG. 2, an upper interval D1 between neighboring bottom electrodes BE that are exposed to or at one opening 140 may be greater than a lower interval D2 between the neighboring bottom electrodes BE. The recessed face R may be partially provided on an upper portion of each of the bottom electrodes BE.

Referring to FIGS. 1 and 3A, a planar circle may be obtained when a boundary N1 between the first and second pillar upper portions P1 and P2 is connected with a lateral surface S1 of the support pattern 112 whose opening 140 exposes the lateral surface S1. When viewed in plan, the bottom electrode BE may have a circular shape whose center C1 is passed through by or passes through the boundary N1.

A dielectric layer 124 may conformally cover a surface of the support pattern 112 and surfaces of the bottom electrodes BE. The dielectric layer 124 may be formed of, e.g., a metal oxide layer such as an aluminum oxide layer whose dielectric constant is greater than that of a silicon oxide layer. The dielectric layer 124 may be covered with a top electrode TE. The top electrode TE may be formed of, e.g., a titanium nitride layer, a tungsten layer, an impurity-doped polysilicon layer, or an impurity-doped silicon germanium layer.

Figure 4:
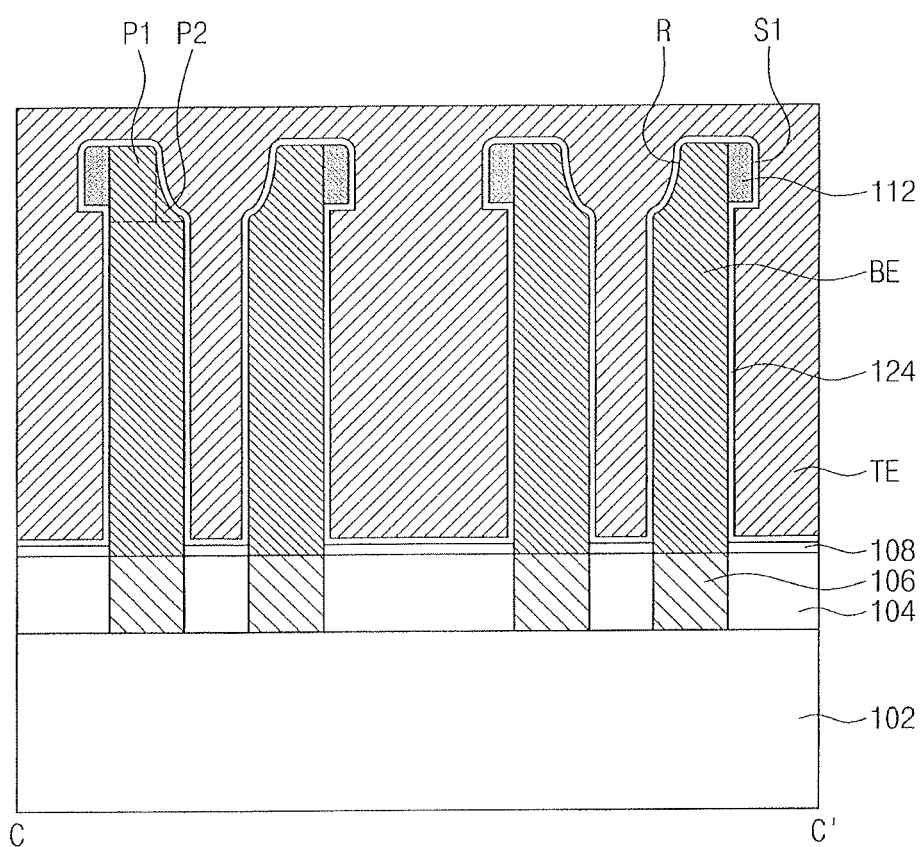
FIG. 4 illustrates a cross-sectional view showing a semiconductor device according to exemplary embodiments.

FIG. 4 illustrates a cross-sectional view showing a semiconductor device according to exemplary embodiments.

Referring to FIG. 4, a semiconductor device according to some embodiments may be configured such that the support pattern 112 has a same or uniform width between lower and upper portions thereof. When a mold layer (see 110 of FIG. 11) is removed in fabricating a semiconductor device, an etchant and/or a process condition may be controlled to change a final shape of the support pattern 112. Other configurations may be identical or similar to those discussed with reference to FIGS. 1 to 3.

Figure 5:
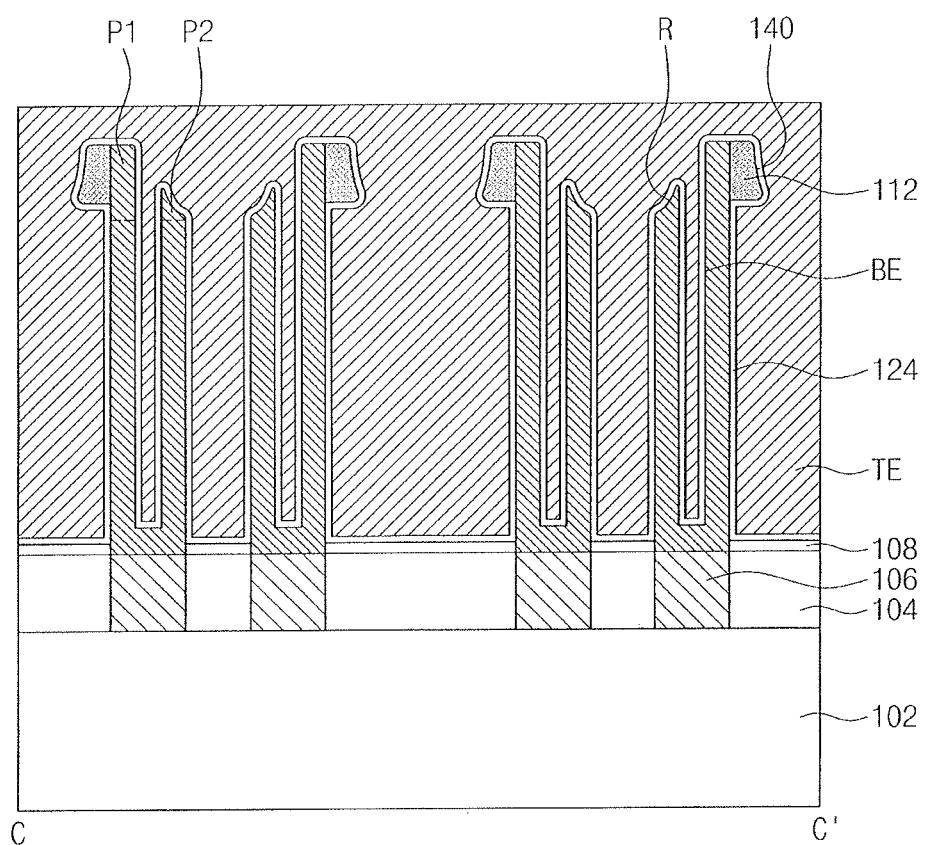
FIG. 5 illustrates a cross-sectional view showing a semiconductor device according to exemplary embodiments.
Figure 6:
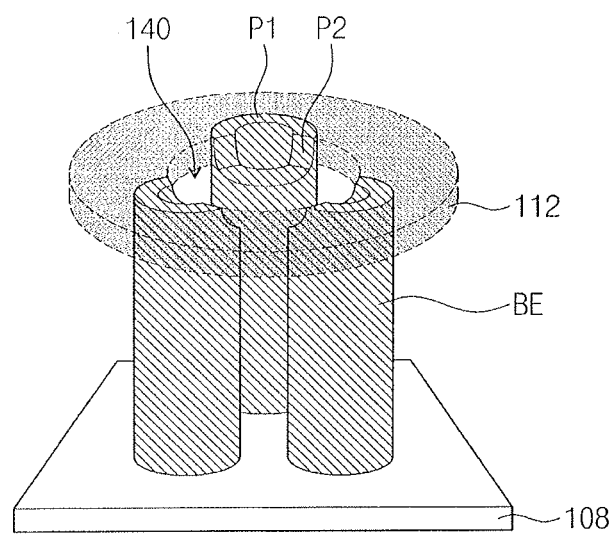
FIG. 6 illustrates a perspective view partially showing the semiconductor device of FIG. 5.

FIG. 5 illustrates a cross-sectional view showing a semiconductor device according to exemplary embodiments. FIG. 6 illustrates a perspective view partially showing the semiconductor device of FIG. 5.

Referring to FIGS. 5 and 6, a semiconductor device according to some embodiments may be configured that the bottom electrode BE has a cup shape whose core is empty (e.g., a hollow cylindrical shape). The bottom electrode BE may include the first pillar upper portion P1 in contact with the support pattern 112 and the second pillar upper portion P2 spaced apart from the support pattern 112. The first pillar upper portion P1 may have a top end at the same height as that of a top end of the support pattern 112. The first pillar upper portion P1 may have a top surface coplanar with that of the support pattern 112.

The bottom electrode BE may have the empty core, as illustrated in FIG. 5, and it appears in FIG. 5 that the second pillar upper portion P2 is spaced apart from the first pillar upper portion P1. However, as illustrated in FIG. 6, the second pillar upper portion P2 may be connected to the first pillar upper portion P1. The second pillar upper portion P2 may have a "C" shape in a plan view. The second pillar upper portion P2 may be exposed within a corresponding one of the openings 140. The second pillar upper portion P2 may have the recessed face R. The recessed face R may be called a concave slope. The support pattern 112 may have a bottom surface (e.g., surface facing the semiconductor substrate 102) at a higher position than that of a bottom end of the recessed face R.

The dielectric layer 124 may conformally cover not only outer and inner sidewalls of the bottom electrode BE but also an inner floor surface of the bottom electrode BE. The dielectric layer 124 may include a high-k dielectric layer such as a metal oxide layer whose dielectric constant is greater than that of the silicon oxide layer. The top electrode TE may be disposed on the dielectric layer 124. The top electrode TE may fill the empty core of the bottom electrode BE. In an implementation, the top electrode TE may be formed to have a double layer including a titanium nitride layer and a silicon germanium layer.

Other configurations may be identical or similar to those discussed with reference to FIGS. 1 to 3.

Figure 7:
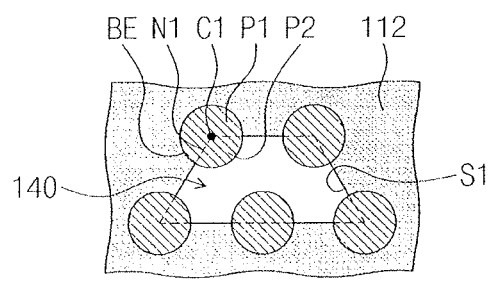
FIG. 7 illustrates a plan view showing a semiconductor device according to exemplary embodiments.

FIG. 7 illustrates a plan view showing a semiconductor device according to exemplary embodiments.

Referring to FIG. 7, the opening 140 may have a planar shape that is different from that shown in FIG. 1. A planar polygonal shape may be obtained when the boundary N1 between the first and second pillar upper portions P1 and P2 is connected with the lateral surface S1 exposed to the opening 140 of the support pattern 112. The polygonal shape may be, e.g., a triangle or a quadrangle. The quadrangle may be, e.g., a rectangle, a trapezoid, or a parallelogram. Other configurations may be identical or similar to those discussed with reference to FIGS. 1 to 6.

FIGS. 8 to 12 illustrate cross-sectional views of stages in a method of fabricating a semiconductor device having the cross-section of FIG. 2.

Figure 8:
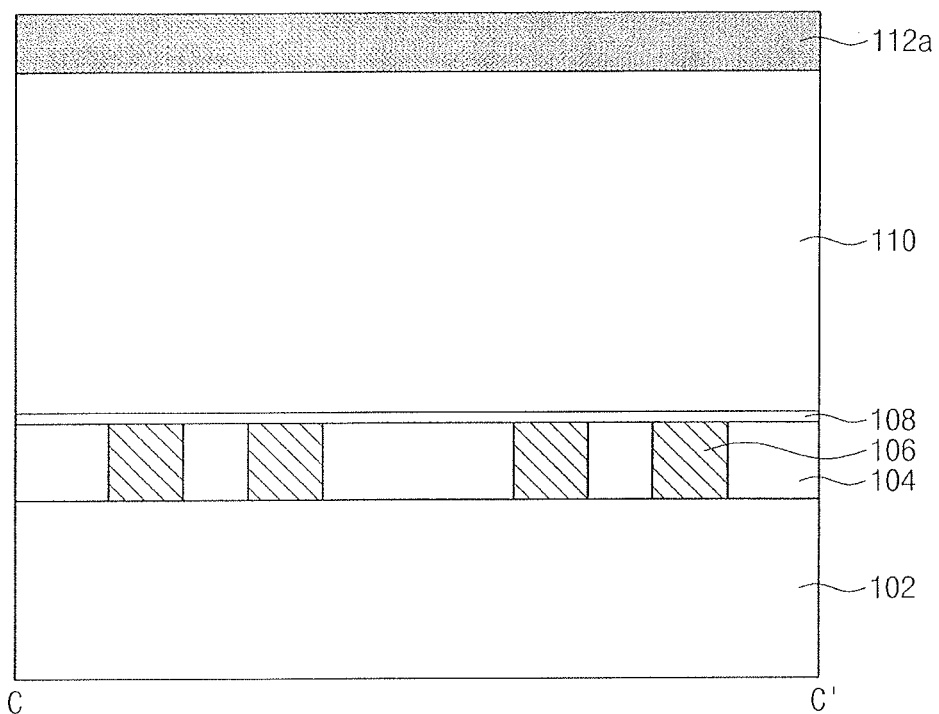
FIGS. 8 to 12 illustrate cross-sectional views of stages in a method of fabricating a semiconductor device having the cross-section of FIG. 2.

Referring to FIG. 8, a semiconductor substrate 102 may be provided. In an implementation, a device isolation layer may be formed on the semiconductor substrate 102, defining active regions. Word lines may be formed in the semiconductor substrate 102, while being insulated from the semiconductor substrate 102 through gate dielectric layers and capping patterns. Impurity regions may be formed in the semiconductor substrate 102 on opposite sides of each of the word lines. Bit lines may be formed on the semiconductor substrate 102 to come into electrical connection to the impurity regions on the sides of the word lines.

An interlayer dielectric layer 104 may be formed on the semiconductor substrate 102. The interlayer dielectric layer 104 may be etched to form contact holes exposing the impurity regions on other sides of the word lines, and the contact holes may be filled with a conductive material and then a planarization etching process may be performed to form bottom electrode contacts 106. Each of the bottom electrode contacts 106 may include one or more of a storage node contact and a landing pad.

An etch stop layer 108 may be formed on the interlayer dielectric layer 104 and the bottom electrode contacts 106. A mold layer 110 and a support layer 112a may be sequentially formed on the etch stop layer 108. The etch stop layer 108 may be formed of a material exhibiting etch selectivity to the mold layer 110. For example, the etch stop layer 108 may be formed of a silicon nitride layer. The mold layer 110 may be formed of a silicon oxide-based layer. When polysilicon is not used to form bottom electrodes (see BE of FIG. 10) which will be discussed below, the mold layer 110 may be formed of a polysilicon layer or a silicon germanium layer. The support layer 112a may be formed of a silicon nitride layer. The etch stop layer 108, the mold layer 110, and the support layer 112a may be formed by a deposition process, such as chemical vapor deposition, atomic layer deposition, physical vapor deposition, or sputtering.

Figure 9:
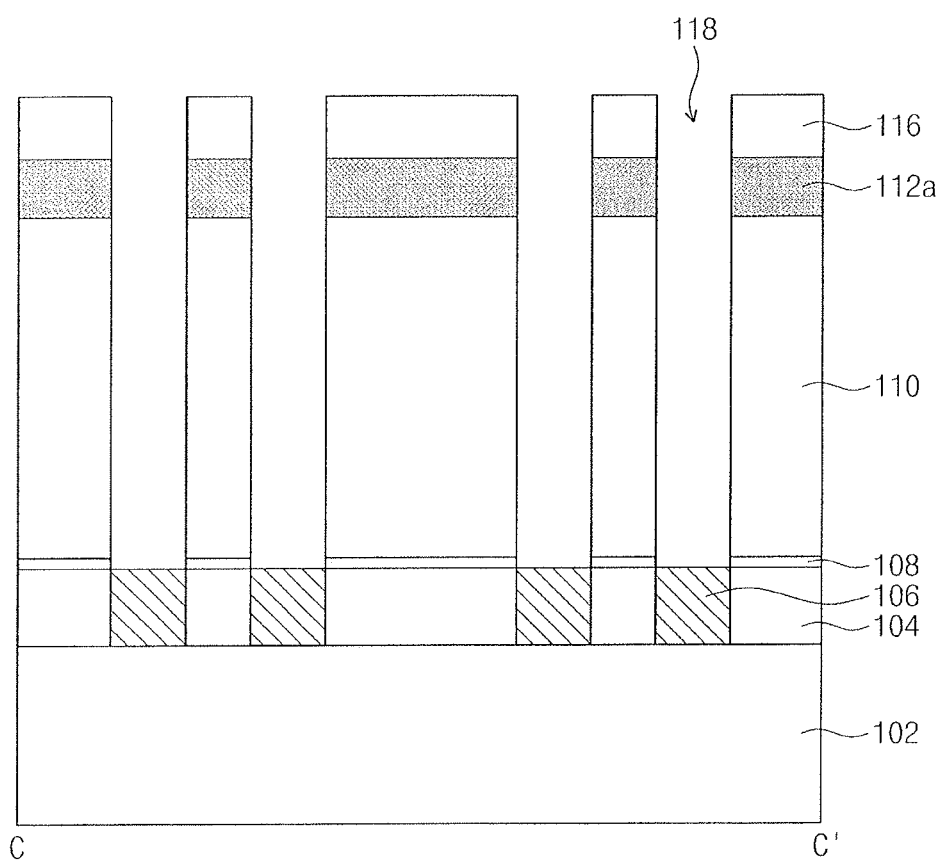

Referring to FIG. 9, a first mask pattern 116 may be formed on the support layer 112a so as to form bottom electrode holes 118. The first mask pattern 116 may include, e.g., a photoresist pattern. The first mask pattern 116 may be used as an etching mask to sequentially pattern the support layer 112a and the mold layer 110, which step may expose the etch stop layer 108. The etch stop layer 108 may be etched to form the bottom electrode holes 118 exposing top surfaces of the bottom electrode contacts 106.

Figure 10:
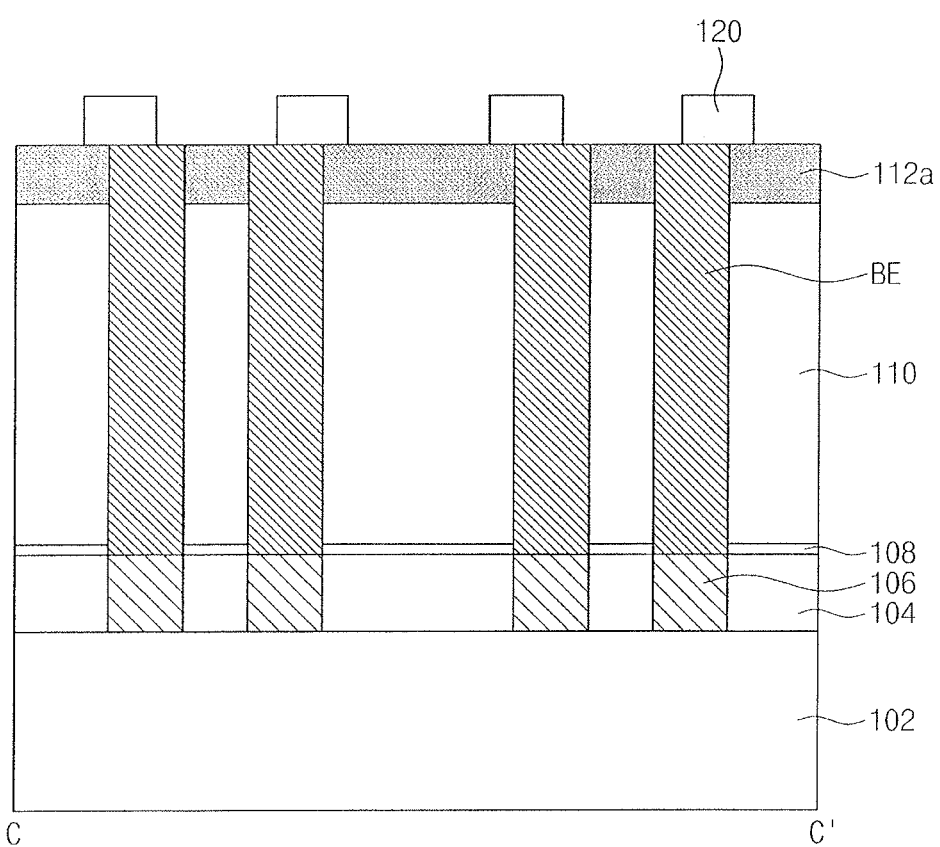

Referring to FIG. 10, the first mask pattern 116 may be removed. When the first mask pattern 116 is formed of a photoresist pattern, an ashing process may be performed to remove the first mask pattern 116. The support layer 112a may then be exposed on or at its top surface. A conductive layer may be conformally stacked to fill the bottom electrode holes 118, and then a planarization etching process, e.g., a chemical mechanical polishing (CMP) or overall etch-back process, may be performed to expose the top surface of the etch stop layer 112a and to simultaneously form bottom electrodes BE in corresponding bottom electrode holes 118. The support layer 112a may serve as a stop layer of the planarization etching process. A second mask pattern 120 may be formed on the bottom electrodes BE and the support layer 112a. The second mask pattern 120 may include mask openings that limit positions and shapes of openings (see 140 of FIG. 11) which will be discussed below.

Figure 11:
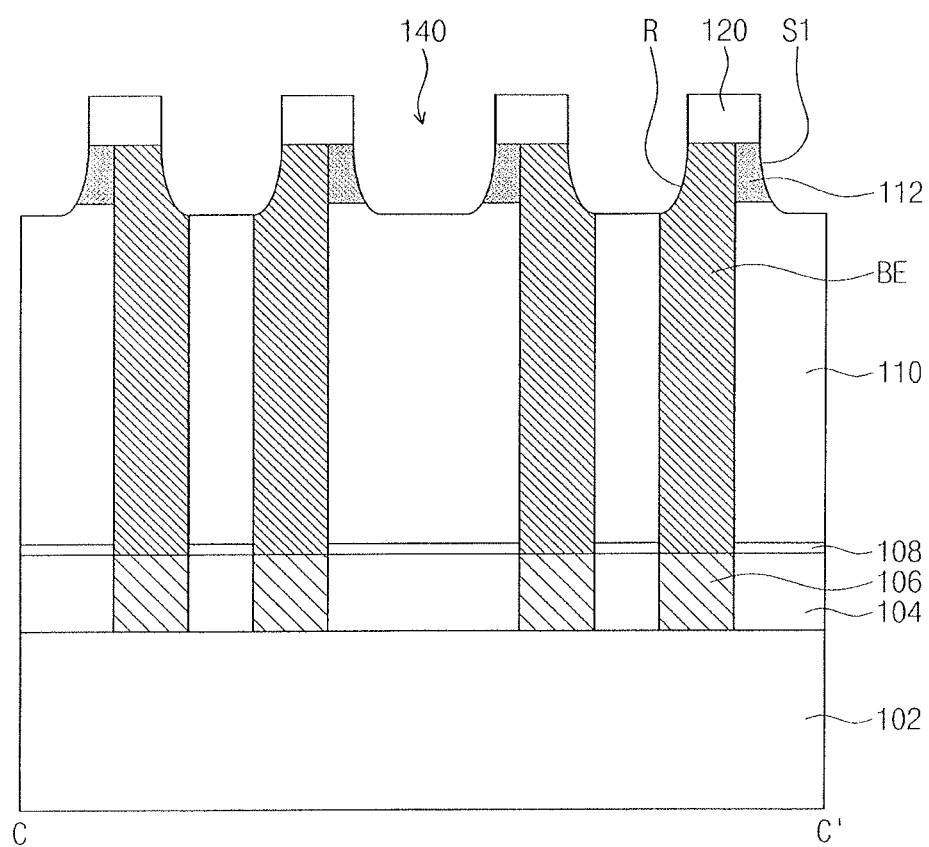

Referring to FIGS. 1 and 11, the second mask pattern 120 may be used as an etching mask to etch the bottom electrodes BE and the support layer 112a, with the result that openings 140 may be formed to expose the mold layer 110. The etching process may be performed as an isotropic etching process that is provided with an etchant that etches the bottom electrodes BE and an etchant that etches the support layer 112a. A recessed face R may be accordingly formed on an upper portion of each of the bottom electrodes BE. The recessed face R formed by the isotropic etching process may have a gently curved surface. The curved surface may increase coating ability of a dielectric layer (see 124 of FIG. 2) which will be discussed below, and as a result, the dielectric layer 124 may be formed to a uniform thickness.

Either synchronous feed or sequential feed may be selected to supply the etchant etching the bottom electrodes BE and the etchant etching the support layer 112a. When the sequential feed is selected, the etchant etching the bottom electrodes BE may be supplied to perform an isotropic etching process, and thereafter the etchant etching the support layer 112a may be supplied to perform an anisotropic etching process. This case may form a support pattern 112 and a bottom electrode BE that are shown in FIG. 4.

When the etching process is performed as an isotropic etching process, the recessed face R may have an abruptly bent cross-sectional profile, not the gently curved profile. For example, the recessed face R may have a deeply excavated corner. In this case, etching process debris may collect in the corner, and furthermore it may be difficult to conformally form on the corner a dielectric layer (see 124 of FIG. 2) which will be discussed below. In conclusion, a semiconductor device may decrease in reliability.

The support layer 112a may be etched into a support pattern 112. The support pattern 112 may have a lateral surface S1 whose profile is similar to that of the recessed face R. The opening 140 may expose the recessed face R and the lateral surface S1 of the support pattern 112. The mold layer 110 may be partially recessed on its upper portion exposed to or at the opening 140. A bowl shape may be formed by the recessed face R, the lateral surface S1 of the support pattern 112, and a recessed top surface of the mold layer 110. This may be a result of over-etching that is performed in order to help prevent a non-etch or not-open phenomenon where a top surface of the mold layer 110 is not revealed. The support pattern 112 may then be finally formed to have a bottom surface at a greater height than that of a bottom end of the recessed face R.

Figure 12:
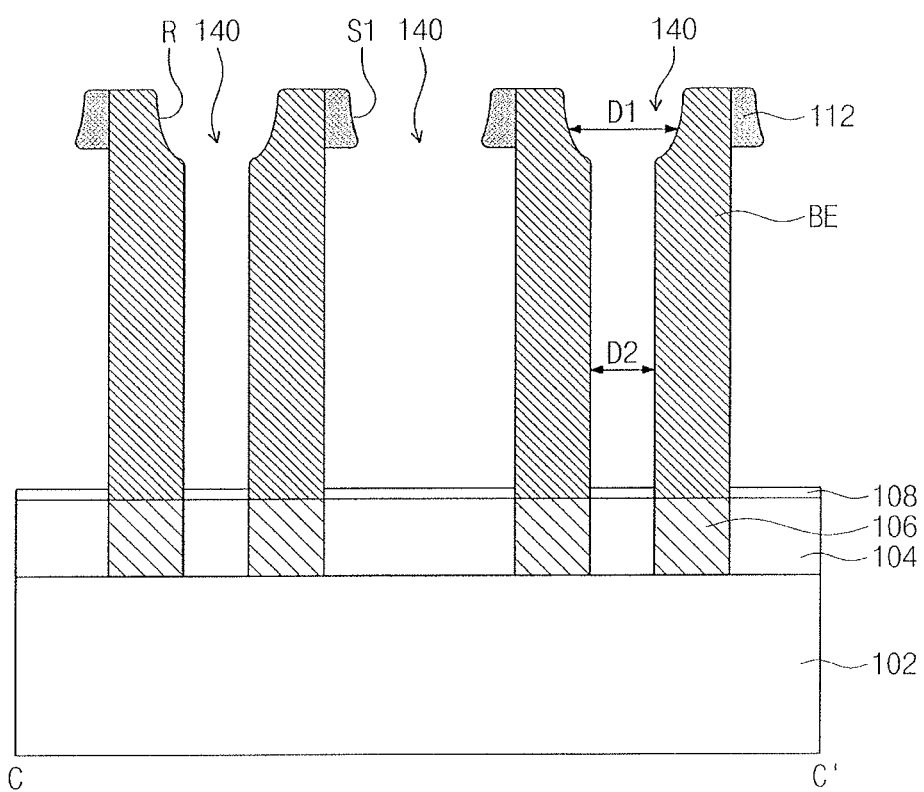

Referring to FIGS. 1 and 12, the second mask pattern 120 may be removed. A removal action may be performed on the mold layer 110 exposed to the opening 140. When the mold layer 110 is formed of a silicon oxide layer, the mold layer 110 may be removed by a dry etching process or a wet etching process using hydrofluoric acid. The removal of the mold layer 110 may expose the bottom surface of the support pattern 112, a lateral surface of the bottom electrode BE below the support pattern 112, and a top surface of the etch stop layer 108. In this step, an interval between upper portions of neighboring bottom electrodes BE may become wider due to the recessed faces R formed on the upper portions of the bottom electrodes BE, and accordingly, an etchant that etches the mold layer 110 may be easily supplied (or diffused) between lower portions of the bottom electrodes BE. The mold layer 110 may therefore be effectively and satisfactorily removed. This structural difference may have a bigger effect as aspect ratio of the bottom electrode BE increases. A lower end portion of the support pattern 112 and/or a protruding portion of the bottom electrode BE may be partially removed when the etching process is performed to remove the mold layer 110.

The openings 140 may be the same in planar shape and spacing. The openings 140 may partially expose lateral surfaces of all the bottom electrodes BE, and areas of the exposed lateral surfaces of the bottom electrodes BE may be the same as each other. Accordingly, a loading effect may be removed or reduced in removing the mold layer 110 and/or depositing a dielectric layer 124 and a top electrode TE which will be discussed below with reference to FIG. 2, and the same process condition may be kept regardless of positions. For example, when the etchant that etches the mold layer 110 is supplied, the mold layer 110 may be removed with the etchant at a uniform concentration profile or regular etch rate in the vicinity of the lateral surfaces of all the bottom electrodes BE, which situation may prevent the bottom electrodes BE from being excessively damaged. Moreover, in subsequent processes discussed below with reference to FIG. 2, a dielectric layer 124 and a top electrode layer TE may be formed to have their thicknesses that are uniform regardless of positions.

The support pattern 112 may be in partial contact with the lateral surfaces of the bottom electrodes BE, and may therefore help prevent collapse of the bottom electrodes BE when the mold layer 110 is removed.

Referring back to FIG. 2, a dielectric layer 124 may be conformally formed on the semiconductor substrate 102. Likewise discussed above, the recessed faces R may cause neighboring bottom electrodes BE to have an interval D1 between their upper portions, on which the recessed faces R are formed, that is wider than an interval D2 between the lower portions of the neighboring bottom electrodes BE, and accordingly, a deposition gas that forms the dielectric layer 124 may be easily supplied (or diffused) between the lower portions of the bottom electrodes BE. The dielectric layer 124 may then be more uniformly formed. This structural difference may have a bigger effect as aspect ratio of the bottom electrode BE increases.

A top electrode TE may be formed on the dielectric layer 124. The top electrode TE may fill a space between the bottom electrodes BE. Likewise discussed above, the interval D1 between the upper portions of neighboring bottom electrodes BE may become wider due to the recessed faces R formed on the upper portions of the neighboring bottom electrodes BE, and accordingly, a deposition gas that forms the top electrode TE may be easily supplied (or diffused) between the lower portions of the bottom electrodes BE. The top electrode TE may then be more easily deposited between the lower portions of the bottom electrodes BE. This structural difference may have a bigger effect as aspect ratio of the bottom electrode BE increases. As a result, a semiconductor device may be fabricated to have enhanced reliability.

Figure 13:
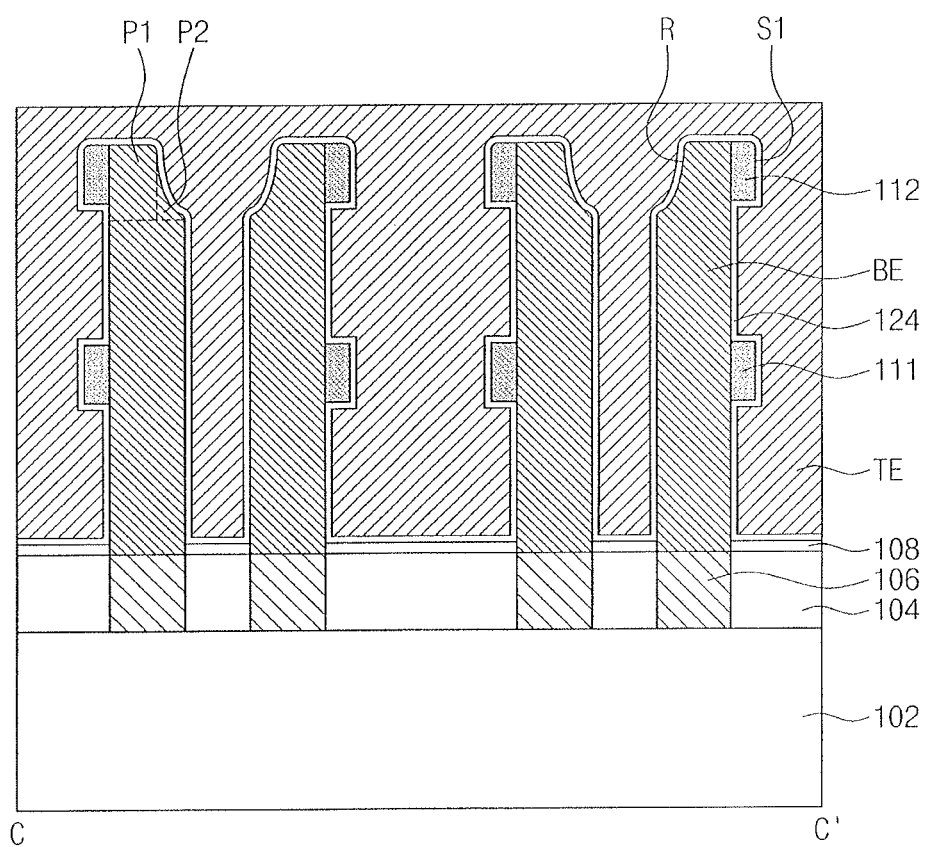
FIG. 13 illustrates a cross-sectional view showing a semiconductor device according to exemplary embodiments.

FIG. 13 illustrates a cross-sectional view showing a semiconductor device according to exemplary embodiments.

Referring to FIG. 13, a semiconductor device according to the present embodiment may further include a subsidiary support pattern 111 below the support pattern 112 (e.g., closer to the semiconductor substrate 102 than the support pattern 112). The subsidiary support pattern 111 may be spaced apart from the support pattern 112. The subsidiary support pattern 111 may have the same planar shape as that of the support pattern 112. The subsidiary support pattern 111 may vertically overlap the support pattern 112. The subsidiary support pattern 111 may have a top surface lower than the bottom end of the recessed face R formed on the upper portion of the bottom electrode BE. The bottom electrode BE may have no recessed portion at the same level as that of the subsidiary support pattern 111, and may have a uniform width below the support pattern 112. The subsidiary support pattern 111 and the support pattern 112 may be formed of the same material, e.g., a silicon nitride layer. The dielectric layer 124 may conformally cover a surface of the subsidiary support pattern 111. Other configurations may be identical or similar to those discussed with reference to FIG. 4.

Figure 14:
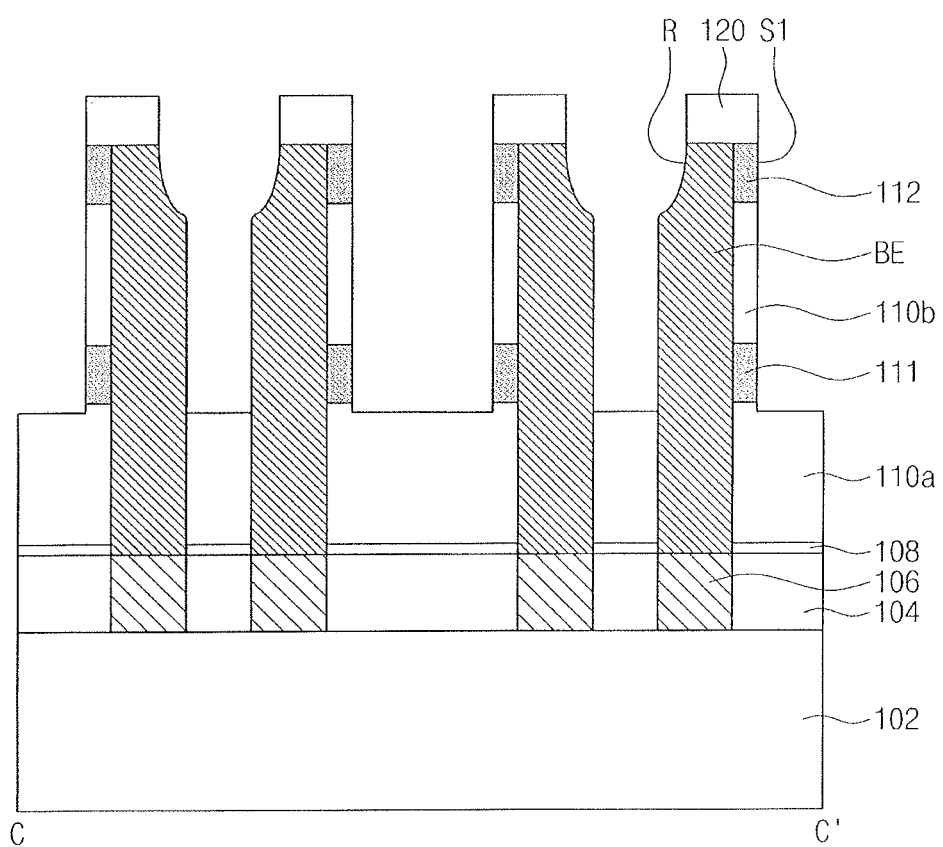
FIG. 14 illustrates cross-sectional view showing a method of fabricating a semiconductor device having the cross-section of FIG. 13.

FIG. 14 illustrates cross-sectional view showing a method of fabricating a semiconductor device having the cross-section of FIG. 13.

Referring to FIG. 14, in the step of FIG. 8, a lower mold layer 110a, a subsidiary support layer, an upper mold layer 110b, and a support layer 112a may be sequentially stacked on the etch stop layer 108. The lower and upper mold layers 110a and 110b may be formed of the same material, e.g., a silicon oxide layer. The subsidiary support layer and the support layer 112a may be formed of the same material, e.g., a silicon nitride layer. The support layer 112a, the upper mold layer 110b, the subsidiary support layer, the lower mold layer 110a, and the etch stop layer 108 may be etched to form the bottom electrode hole 118 as similar to that shown in FIG. 9, following which the bottom electrode BE may be formed as similar to that shown in FIG. 10. As similar to that shown in FIG. 11, the second mask pattern 120 may be used as an etching mask to perform an isotropic etching process that is supplied with the etchant that etches the bottom electrode BE and the etchant that etches the support layer 112a. The opening 140 may be formed to expose an upper portion of the upper mold layer 110b. The recessed face R may be accordingly formed on the upper portion of each of the bottom electrodes BE. The support layer 112a may be etched into the support pattern 112.

Referring successively to FIG. 14, an etchant that etches the upper mold layer 110b may be provided to perform an isotropic etching process under a state that the second mask pattern 120 is still used as an etching mask, which action may expose the subsidiary support layer. An etchant that etches the subsidiary support layer may be provided to perform an anisotropic etching process to pattern the subsidiary support layer without providing the etchant that etches the bottom electrode BE, which procedure may form the subsidiary support pattern 111 and expose the lower mold layer 110a.

The lower and upper mold layers 110a and 110b may be removed. The dielectric layer 124 and the top electrode TE may be deposited to fabricate a semiconductor device of FIG. 13.

By way of summation and review, semiconductor devices are being highly integrated with the remarkable development of the electronic industry. Line widths of patterns of semiconductor devices may be reduced for high integration thereof. New and/or expensive exposure techniques may be used for fineness of the patterns, and it may be difficult to highly integrate semiconductor devices. New integration techniques may be considered. For example, burying word lines inside a semiconductor substrate in DRAM memory devices may be considered.

The embodiments may provide a semiconductor device having enhanced reliability.

According to some embodiments, a semiconductor device may be configured such that the concave slope is formed on the upper portion of the bottom surface and the dielectric layer is conformally formed. As a result, a semiconductor device may be fabricated to have enhanced reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first bottom electrode and a second bottom electrode on a semiconductor substrate, the first bottom electrode including a first region and a second region and the second bottom electrode including a third region and a fourth region, the second region and the third region facing each other, the first region being on an outer side of the second region, and the fourth region being on an outer side of the third region; and
a support pattern contacting a side surface of each of the first region and the fourth region, a side surface of the support pattern having a slope,
wherein:
a top surface of each of the first region and the fourth region is higher than a top surface of each of the second region and the third region, and
a first distance between an upper portion of the second region and an upper portion of the third region at a first level is greater than a second distance between a lower portion of the second region and a lower portion of the third region at a second level that is different from the first level.

2. The semiconductor device as claimed in claim 1, wherein a third distance between the upper portion of the second region and the upper portion of the third region at a third level, different from the first level, is less than the first distance and is greater than the second distance.

3. The semiconductor device as claimed in claim 1, wherein an upper width of the support pattern contacting the first region and the fourth region is less than a lower width of the support pattern contacting the first region and the fourth region.

4. The semiconductor device as claimed in claim 1, wherein a top surface of the support pattern is coplanar with the top surface of the first region and the fourth region.

5. The semiconductor device as claimed in claim 1, wherein:
the first bottom electrode and the second bottom electrode have a hollow cylindrical shape,
a lower portion of the first region is in contact with the lower portion of the second region, and
the lower portion of the third region is in contact with a lower portion of the fourth region.

6. The semiconductor device as claimed in claim 1, wherein:
the first bottom electrode and the second bottom electrode have a pillar shape,
the first region and the second region of the first bottom electrode contact each other, and
the third region and the fourth region of the second bottom electrode contact each other.

7. The semiconductor device as claimed in claim 1, wherein the upper portion of the second region and the upper portion of the third region each have a slope.

8. The semiconductor device as claimed in claim 7, wherein a height of a bottom surface of the support pattern from the semiconductor substrate is greater than a height of a bottommost end of the slope of the upper portion of the second region or the third region from the semiconductor substrate.

9. The semiconductor device as claimed in claim 1, wherein a bottom surface of the support pattern is lower than the top surface of the second region and/or the third region.

10. The semiconductor device as claimed in claim 1, further comprising:
a third bottom electrode including a fifth region and a sixth region; and
an opening in the support pattern,
wherein the opening exposes the upper portion of the second region, the upper portion of the third region, and an upper portion of the fifth region, and
wherein the support pattern contacts a side surface of the sixth region.

11. The semiconductor device as claimed 1, wherein the support pattern includes a rounded portion.

12. A semiconductor device, comprising:
a plurality of bottom electrodes on a semiconductor substrate; and
a support pattern having at least one opening,
wherein each of the plurality of bottom electrodes includes a first bottom electrode upper portion contacting the support pattern and a second bottom electrode upper portion spaced apart from the support pattern,
wherein the opening exposes the respective second bottom electrode upper portions of at least three of the plurality of bottom electrodes,
wherein a side surface of the support pattern has a slope.

13. The semiconductor device as claimed in claim 12, wherein an upper width of the support pattern contacting the first bottom electrode upper portion is less than a lower width of the support pattern contacting the first bottom electrode upper portion.

14. The semiconductor device as claimed in claim 12, wherein a top surface of the first bottom electrode upper portion is higher than a top surface of the second bottom electrode upper portion.

15. The semiconductor device as claimed in claim 12, wherein:
each of the plurality of bottom electrodes further includes a second bottom electrode lower portion contacting the second bottom electrode upper portion, and
a first distance between respective second bottom electrode upper portions of adjacent ones of the plurality of bottom electrodes at a first level is greater than a second distance between respective second bottom electrode lower portions of adjacent ones of the plurality of bottom electrodes at a second level, different from the first level.

16. The semiconductor device as claimed in claim 15, wherein a third distance between respective second bottom electrode upper portions of adjacent ones of the plurality of bottom electrodes at a third level, different from the first level, is less than the first distance and is greater than the second distance.

17. The semiconductor device as claimed in claim 12, wherein:
each of the plurality of bottom electrodes has a hollow cylindrical shape, and
the first bottom electrode upper portion is spaced apart from the second bottom electrode upper portion in a cross-sectional view.

18. The semiconductor device as claimed in claim 12, wherein:

each of the plurality of bottom electrodes has a pillar shape, and
the first bottom electrode upper portion contacts the second bottom electrode upper portion in a cross-sectional view.

19. The semiconductor device as claimed in claim 12, wherein:
the second bottom electrode upper portion of each of the plurality of bottom electrodes has a slope, and
a height of a bottom surface of the support pattern from the semiconductor substrate is greater than a height of a bottommost end of the slope of one of the plurality of bottom electrodes from the semiconductor substrate.

20. The semiconductor device as claimed in claim 12, wherein a bottom surface of the support pattern is lower than a top surface of the second bottom electrode upper portion.

21. The semiconductor device as claimed in claim 12, wherein a top surface of the support pattern is coplanar with the top surface of the first bottom electrode upper portion.

22. The semiconductor device as claimed in claim 12, wherein the support pattern includes a rounded portion.

\* \* \* \* \*